(12) United States Patent
Olesen

(10) Patent No.: US 7,360,582 B2
(45) Date of Patent: Apr. 22, 2008

(54) FLOW DISTRIBUTING UNIT AND COOLING UNIT HAVING BYPASS FLOW

(75) Inventor: Klaus Kristen Olesen, Soenderborg (DK)

(73) Assignee: Danfoss Silicon Power GmbH, Schleswig (DE)

( * ) Notice: Subject to any disclaimer, the term of this patent is extended or adjusted under 35 U.S.C. 154(b) by 185 days.

(21) Appl. No.: 10/577,027

(22) PCT Filed: Oct. 26, 2004

(86) PCT No.: PCT/DK2004/000736

§ 371 (c)(1),
(2), (4) Date: Apr. 25, 2006

(87) PCT Pub. No.: WO2005/041627

PCT Pub. Date: May 6, 2005

(65) Prior Publication Data

US 2007/0119574 A1  May 31, 2007

(30) Foreign Application Priority Data

Oct. 27, 2003  (DK) .............................. 2003 01576

(51) Int. Cl.
*F28F 7/02* (2006.01)

(52) U.S. Cl. ..................... 165/80.4; 165/101; 361/702

(58) Field of Classification Search ............... 165/80.4, 165/80.5, 100, 101, 153; 361/699, 702
See application file for complete search history.

(56) References Cited

U.S. PATENT DOCUMENTS

| | | | | | |
|---|---|---|---|---|---|
| 3,909,118 | A | * | 9/1975 | Schmidt | 359/845 |
| 5,005,640 | A | * | 4/1991 | Lapinski et al. | 165/170 |
| 5,239,200 | A | * | 8/1993 | Messina et al. | 257/714 |
| 5,841,634 | A | | 11/1998 | Visser | 361/699 |
| 6,307,871 | B1 | * | 10/2001 | Heberle | 372/34 |
| 6,499,533 | B2 | * | 12/2002 | Yamada | 165/80.1 |
| 2001/0050162 | A1 | * | 12/2001 | Valenzuela | 165/80.4 |
| 2006/0133063 | A1 | * | 6/2006 | Chordia et al. | 165/80.4 |

* cited by examiner

*Primary Examiner*—Teresa J. Walberg
(74) *Attorney, Agent, or Firm*—McCormick, Paulding & Huber LLP

(57) ABSTRACT

A cooling unit for cooling in particular power semiconductors contains a distributor for guiding liquid across a surface to be cooled. The distributor comprises an inlet manifold (8) and outlet manifold (9), whereby the inlet and outlet manifolds are connected through a flow cell, which has a main flow channel (50). The main channel is formed as a meandering sequence of channel segments (61,62,63,64). It has been found, that the transfer of heat by the liquid in the main flow channel can be improved by introducing a bypass flow channel (71,72,73) which allows the flow of liquid from the cell inlet to the cell outlet, wherein the bypass flow channel interconnects the channel segments of the main flow channel.

4 Claims, 3 Drawing Sheets

FLOW DISTRIBUTING UNIT AND COOLING UNIT HAVING BYPASS FLOW

CROSS REFERENCE TO RELATED APPLICATIONS

This application is entitled to the benefit of and incorporates by reference essential subject matter disclosed in International Patent Application No. PCT/DK2004/000736 filed on Oct. 26, 2004 and Danish Patent Application No. PA 2003 01576 filed Oct. 27, 2003.

FIELD OF THE INVENTION

This invention relates to a flow distributing unit which is suitable for a variety of cooling applications, and in particular for liquid cooling of power semiconductors. The invention also relates to a cooling unit employing such a flow distributing unit.

BACKGROUND OF THE INVENTION

Semiconductor devices generate heat during their operation, and this heat usually acts to degrade the operation of the semiconductor device. For power semiconductor devices it is necessary to be cooled during operation to maintain acceptable device performance, and for high power semiconductors liquid cooling is often applied.

U.S. Pat. No. 5,841,634 discloses a liquid-cooled semiconductor device. The semiconductors are here placed inside a housing on a plate which is to be cooled. The device shows a fluid inlet port and a fluid outlet port, and a baffle placed in a chamber inside the housing. The baffle includes a wall separating the chamber into a top portion and a bottom portion, and walls separating each portion into compartments. A number of holes in the wall between top and bottom portion provide fluid communication between the portions. Fluid is led from the inlet port to a first bottom compartment, and then through holes to a first top compartment holes to a second bottom compartment. From the second bottom compartment the fluid is led to a second top compartment, where it cools another area of the plate to be cooled. After having passed three top compartments the fluid it led to the fluid outlet port, and out of the device. Thus the cooling compartments of the device are connected in a serial manner.

As the fluid passes the first top compartment, it takes up heat from the plate to be cooled and thus leaves the first top compartment at a higher outlet temperature than the inlet temperature. When the fluid then reaches the second top compartment, additional heating of the fluid will take place, and this will lead to a temperature difference on the cooled plate, from fluid inlet port end to fluid outlet port end. This is detrimental to the lifetime of such a power semiconductor device as high power semiconductors are very sensitive to temperature variations and also sensitive to the general temperature level.

Also the serial connection of multiple cooling compartments will have a high flow resistance as a result, leading to a high pressure drop or a low flow rate of the fluid through the cooling device.

BRIEF SUMMARY OF THE INVENTION

It is an object of this invention to provide a flow distributing unit, and a cooling unit employing such a flow distributing unit, which leads to less variation in temperature along the cooled surface than previously known units.

This and other objects are achieved with a distributor for distributing a flow of liquid over a surface to be cooled which comprises an inlet manifold, an outlet manifold and at least one flow cell connected between the manifolds. The flow cell comprises a cell inlet in fluid communication with the inlet manifold, a cell outlet in fluid communication with the outlet manifold, and a main flow channel formed as a meandering sequence of channel segments for guiding a main flow of liquid from the cell inlet along the surface to the cell outlet with a plurality of changes in the direction of the main flow. Additionally, the flow cell comprises a bypass flow channel for allowing a bypass flow of liquid from the cell inlet to the cell outlet, and the configuration is such that the bypass flow channel interconnects the channel segments of the main flow channel.

It has been found that the short-circuiting effect of the bypass flow channel leads to increased turbulence and mixing of the cooling liquid as it passes along the main flow channel. This is believed to occur because the liquid flowing in the bypass flow will generally flow into the channel segments of the main flow channel at angles which are transverse to the direction of the main flow.

This causes turbulence and changes in the flow pattern of the liquid within the cells. Liquid which has been heated by passing closely along the cooled surface, will be effectively mixed with colder liquid which has not passed along the cooled surface. This ensures that the full heat capacity of the liquid is put to use in the cooling process.

BRIEF DESCRIPTION OF THE DRAWINGS

Now having described the invention in general terms, preferred embodiments of the invention will be described in details with reference to the drawings, showing.

DETAILED DESCRIPTION OF THE INVENTION

Figure 1:
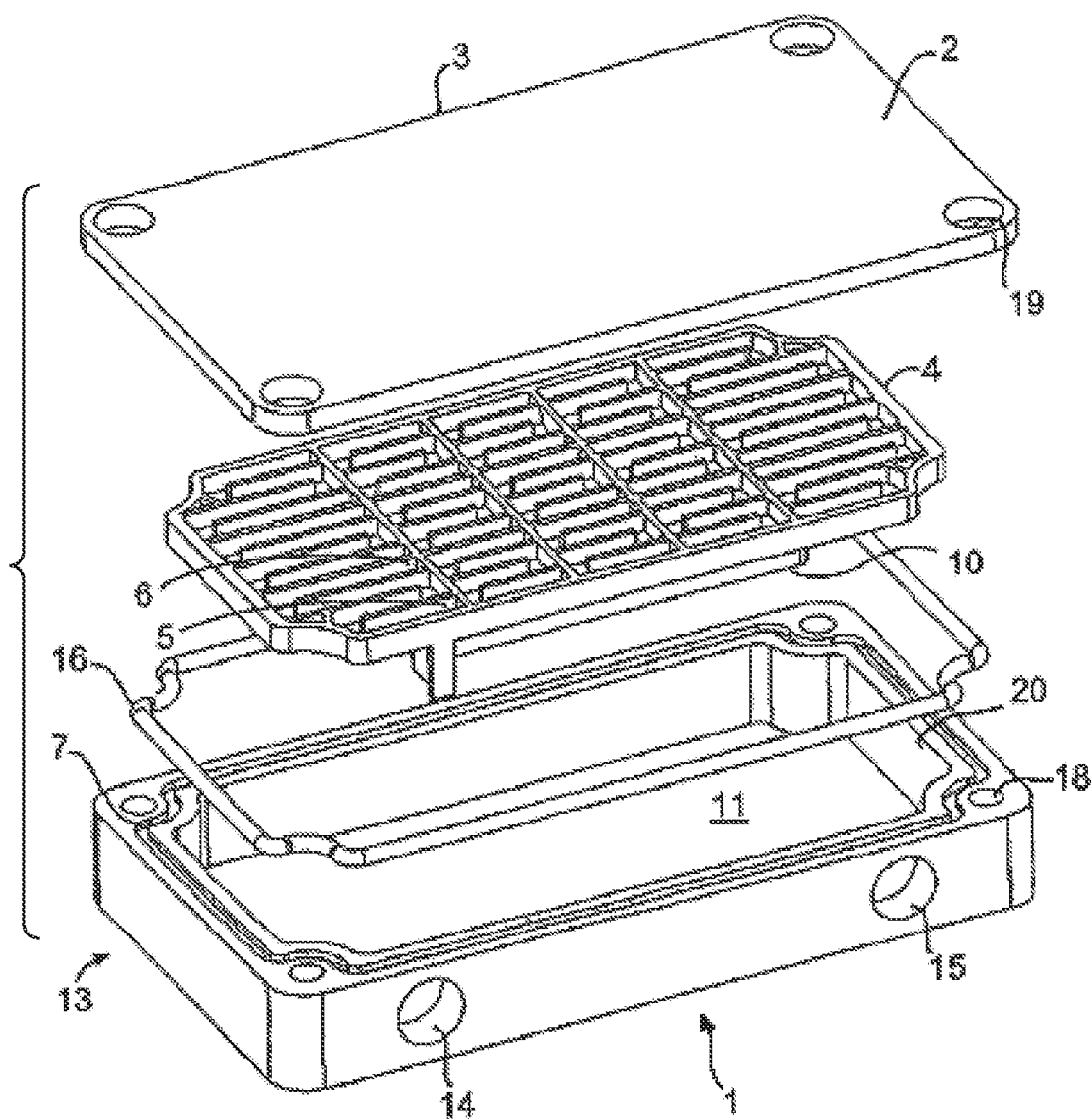
FIG. 1 is an exploded view of a cooling unit.

Turning now to FIG. 1, a cooling unit 1 includes a housing 13, formed as a box with a flat back plate 11 and side walls 20 which extend from the back towards a main opening at the front of the box. The housing 13 has an inlet opening 15 and an outlet opening 14 for liquid connections from a pipe system or the like.

A baffle 4 fits with the internal surfaces of the side walls 20 of the housing 13. When the baffle 4 is placed in the housing 13, it divides this into a top compartment and a bottom compartment. The bottom compartment is formed between the back plate 11 and the baffle 4, and is further divided into two chambers or manifolds, as will be described later. The openings 14 and 15 are in fluid communication with the bottom compartments.

A top plate 3, the lower surface of which is to be cooled, closes the top compartment when it is mounted on the main opening on the housing 13, by the intermediate of a sealing ring 16. This sealing ring 16 fits into a groove 17 of the housing 13, and seals between the side walls 20 and the top plate 3. The top plate 3 is fixed to the housing 13 by means of screws (not shown in the drawings), which are screwed into holes 18 of the housing 13 through holes 19 in the top plate 3. The top plate 3 will be referred to as the cooled plate, since this plate is cooled by liquid led through the cooling unit. If the cooling unit is employed to cool power semiconductor circuits, the circuits may be arranged on top of the cooled plate 3 in a manner that will be obvious to those skilled in the art. Of course the cooling unit may be employed to cool various other sources of heat such as a hot gas or liquid flowing along the exposed surface of the cooled plate 3.

Figure 2:
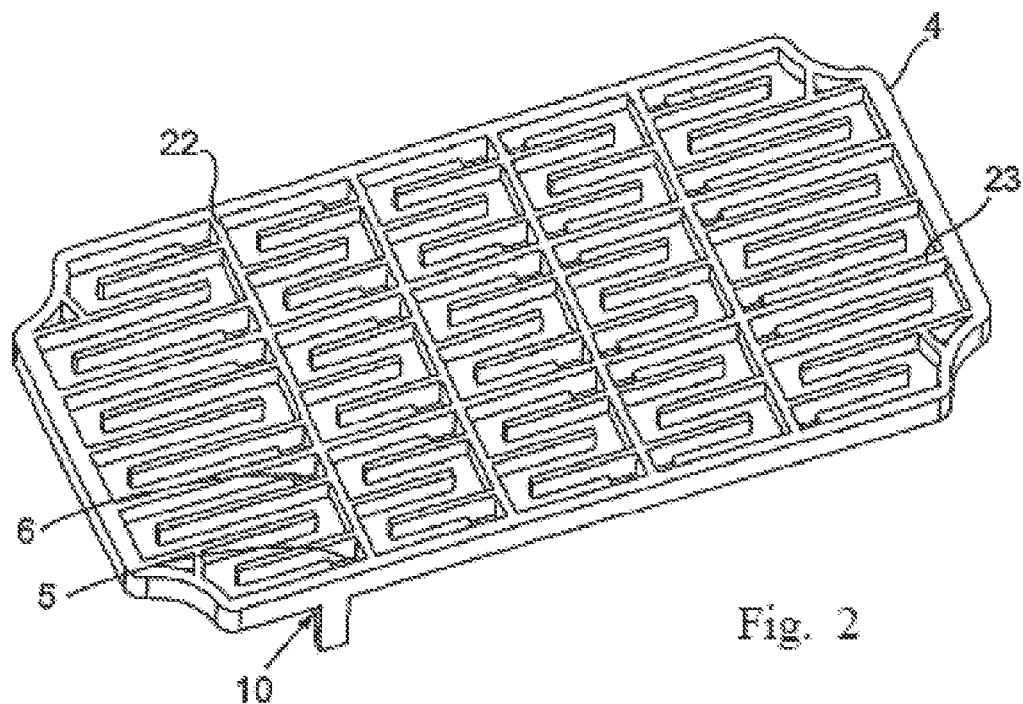
FIG. 2 is a perspective top view of a flow distributing baffle.
Figure 3:
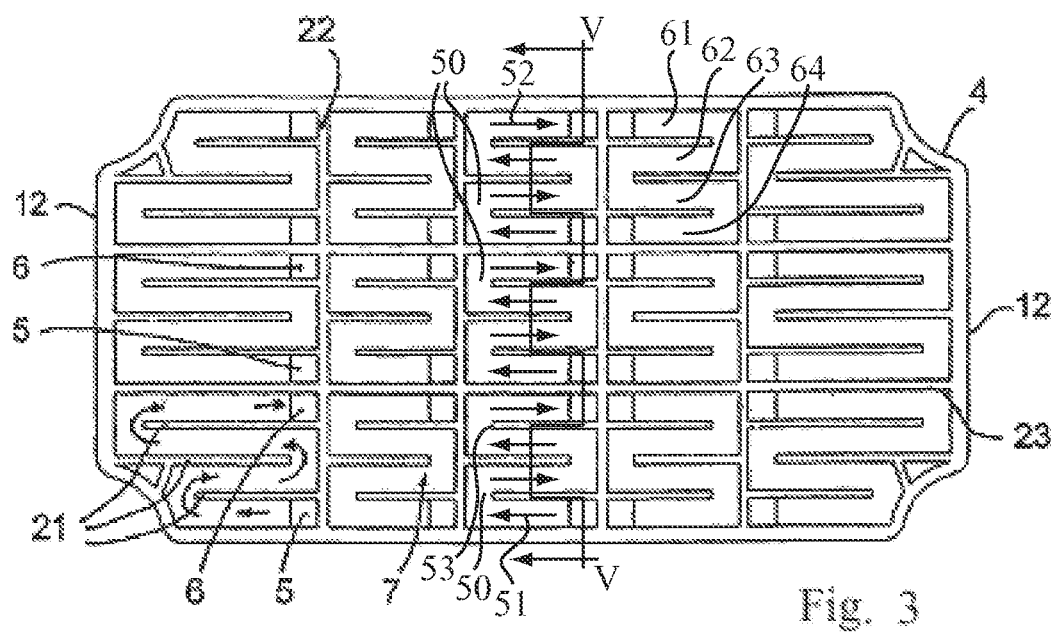
FIG. 3 is a top view of the distributing baffle.

FIG. 2 shows the baffle 4, in a perspective view slightly more angled than at FIG. 1. Visible in this view are inlets 5 and outlets 6, the location of which was indicated in FIG. 1 by the same reference numeral. The top view of the baffle 4 in FIG. 3 shows the inlets 5 and outlets 6 even more clearly. Liquid flows from the bottom compartment to the top compartment through the inlets 5. While in the top compartment, the flow of liquid is directed along the cooled surface (the bottom surface) of the top plate 3 by guiding wall sections 21 which extend upwards from the center plane or base 25 of the baffle 4, as indicated by arrows in FIG. 3. The flow then returns from the top compartment to the bottom compartment through the outlets 6.

As will be easily seen in FIG. 3, the guiding wall sections 21 leave a meandering flow path for the liquid, by means of an open passage at one end of each wall section. Other wall sections, however, run all the way through the structure, like wall sections 22 and 23. These through-going walls divide the top compartment into cells, each with an inlet 5 and an outlet 6.

Figure 4:
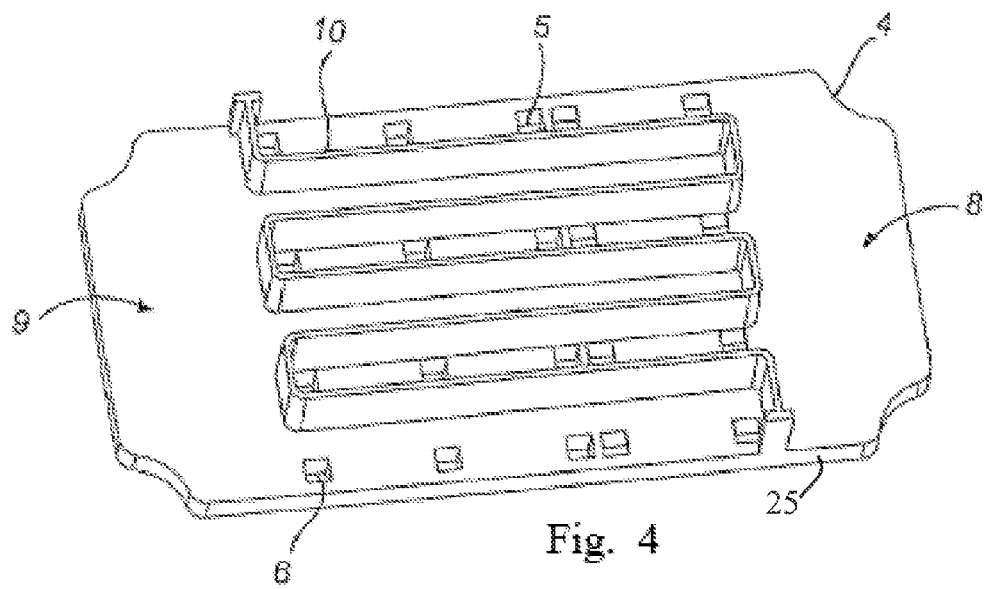
FIG. 4 is a perspective bottom view of the distributing baffle.

As mentioned previously, the bottom compartment is divided into two chambers or manifold. FIG. 4 shows a perspective view of the baffle from the bottom side. A wall section 10, running in a snake-like pattern along the bottom side, will bear on the bottom plate 11 of the housing 13 in substantially liquid-proof abutment. The bottom compartment of the baffle 4 is hereby divided into an inlet compartment or manifold 8 and an outlet compartment or manifold 9, when the baffle is placed in the housing. All cell inlets 5 are in connection with the inlet manifold 8, and all cell outlets 6 are in connection with the outlet manifold 9. The cells of the top compartment, FIGS. 2 and 3, are thus all connected in parallel between the inlet manifold 8 and the outlet manifold 9, and thus in parallel between inlet and outlet, positions 15 and 14 of FIG. 1.

The inlets 5 and the outlets 6 are placed such that the outlet of one cell is next to an inlet of another cell. This has the effect that heated liquid, which is about to leave one cell, is close to unheated liquid which has just entered a neighbouring cell. This serves to minimize the heat gradient along the cooled plate 3. The heat gradient along the cooled plate is further minimized by varying the size of the area which the cells covers. Along the edges 12 the area of each cell is larger than on the rest of the surface, whereby the cooling in the area along the edges 12 is less effective than on the rest of the area. This reflects a situation where the density of heat generating elements is lower along the edges of a semiconductor device than on the rest of the device. Lowering the cooling effect along the edges of the cooling unit will improve temperature uniformity across the cooled plate.

In the embodiment of the invention shown in FIGS. 1 to 4, it is intended that a substrate with semiconductors be placed on top of the cooled plate 3, in a way known to those skilled in the art. The cooled plate could however be the substrate itself, placed directly as a cover on the cooling unit. This is a consequence of the minimized heat gradient along the cooled plate, which makes the traditional heat spreading plate, shown in FIG. 1 as the cooled plate 3, superfluous in some applications.

Figure 5:
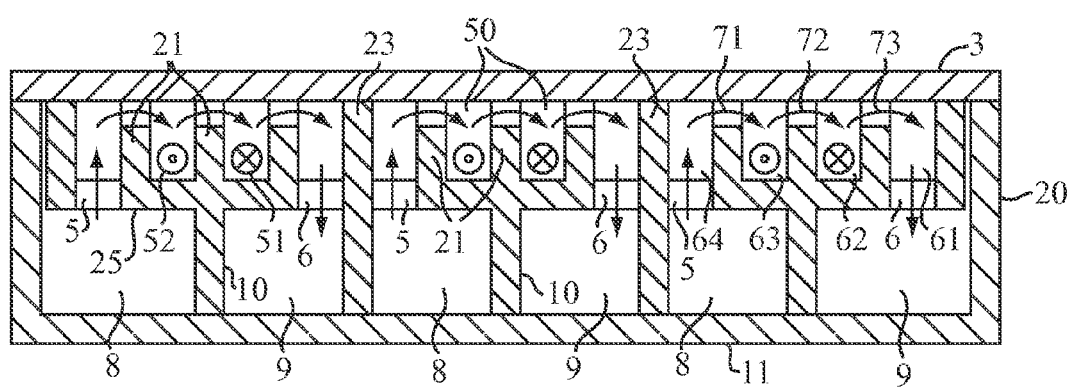
FIG. 5 is a simplified sectional view of the cooling unit illustrating the provision of a bypass flow path.

FIG. 5 shows a simplified sectional view of an assembled cooling unit, cut along the line V-V as indicated in FIG. 3. Sealing details between the side walls 20 and the cooled plate 3 have been left out for simplicity. As shown in FIG. 5, the meandering flow channel 50 in each flow cell causes successive changes in the direction of fluid flow as indicated by the arrows 51, 52. The meandering flow channel may be thought of as a sequence of channel segments 64, 63, 62, 61 along which the flow passes on its way from the cell inlet 5 to the cell outlet 6. Those channel segments are delimited by the guiding wall sections 21 of the baffle 4, and by the cooled surface of the cooled plate 3.

As the liquid flows from one channel segment to the next, it must pass around the end 53 of the wall segment 21 which separates any two channel segments 64, 63, 62, 61 from each other. This has been found to cause vigorous mixing of the liquid as it flows along the flow channel, which benefits the transfer of heat from the cooled plate to the liquid.

Experience shows, however, that the transfer of heat may be improved further by allowing a bypass flow of liquid from channel segment to channel segment over the top of the wall segments. This is illustrated in FIG. 5 at 71-73. Each guiding wall section 21 ends at a small distance from the bottom surface of the cooled plate 3, leaving a narrow gap through which a bypass flow 71, 72, 73 may pass from one channel segment to the next. The bypass flow proceeds generally at right angles to the main flow in the channel segments. Therefore the bypass flow is believed to cause increased turbulence in the flow pattern near the surface of the cooled plate. Experiments and computational simulations have shown that the transfer of heat from the cooled plate to the liquid will increase significantly, and that the flow resistance of the cooling unit will be substantially reduced, by providing such bypass flow through a gap between the tops of the guiding walls 21 and the adjacent surface of the cooled plate 3. The successive gaps effectively define a bypass flow path within each flow cell, from the cell inlet 5 to the cell outlet 6, which interconnects neighbouring channel sections 61, 62, 63, 64 of the meandering main flow channel.

While the present invention has been illustrated and described with respect to a particular embodiment thereof, it should be appreciated by those of ordinary skill in the art that various modifications to this invention may be made without departing from the spirit and scope of the present invention.

What is claimed is:

1. A distributor for distributing a flow of liquid over a surface to be cooled, the distributor comprising:

an inlet manifold;

an outlet manifold; and at least one flow cell conneded between the manifolds, the flow cell comprising:

a cell inlet in fluid communication with the inlet manifold;

a cell outlet in fluid communication with the outlet manifold;

a main flow channel formed by wall segments extending from a base to the surface to be cooled and as a meandering sequence of channel segments for guiding a main flow of liquid from the cell inlet along the surface to the cell outlet with a plurality of changes in the direction of the main flow; and a bypass flow channel formed by gaps between the wall segments and the surface to be cooled for allowing a bypass flow of liquid from the cell inlet to the cell outlet; wherein the bypass flow channel interconnects the channel segments of the main flow channel.

2. The distributor as in claim 1 wherein a plurality of flow cells is interconnected between the manifolds, and wherein each of the flow cells comprises a bypass flow channel.

3. The liquid-coolable unit for removing heat from a heat source, the unit comprising a plate heated by the heat source and a distributor as claimed in claim 1 for distributing a flow of cooling liquid over a surface of the plate.

4. The liquid-coolable electronic unit, the unit comprising an electronic circuit encapsulated in a circuit module having an outer surface, and a distributor as claimed in claim 1 for distributing a flow of cooling liquid over the surface.

* * * * *

UNITED STATES PATENT AND TRADEMARK OFFICE
CERTIFICATE OF CORRECTION

PATENT NO. : 7,360,582 B2
APPLICATION NO. : 10/577027
DATED : April 22, 2008
INVENTOR(S) : Klaus Kristen Olesen It is certified that error appears in the above-identified patent and that said Letters Patent is hereby corrected as shown below:

Column 4, claim 1, line 59 please delete the word "conneded" and replace with the word --connected--.

Signed and Sealed this

Fifth Day of August, 2008

JON W. DUDAS
*Director of the United States Patent and Trademark Office*